(12) United States Patent
Klauk et al.

(10) Patent No.: US 7,202,547 B2
(45) Date of Patent: Apr. 10, 2007

(54) CAPACITOR WITH A DIELECTRIC INCLUDING A SELF-ORGANIZED MONOLAYER OF AN ORGANIC COMPOUND

(75) Inventors: Hagen Klauk, Erlangen (DE); Marcus Halik, Erlangen (DE); Ute Zschieschang, Erlangen (DE); Guenter Schmid, Hemhofen (DE); Franz Effenberger, Stuttgart (DE)

(73) Assignee: Infineon Technologies, AG, Munich (DE)

( * ) Notice: Subject to any disclaimer, the term of this patent is extended or adjusted under 35 U.S.C. 154(b) by 244 days.

(21) Appl. No.: 11/046,905

(22) Filed: Feb. 1, 2005

(65) Prior Publication Data

US 2005/0167660 A1 Aug. 4, 2005

(30) Foreign Application Priority Data

Feb. 2, 2004 (DE) ..................... 10 2004 005 082

(51) Int. Cl.
*H01L 29/00* (2006.01)
(52) U.S. Cl. ...................................... 257/532
(58) Field of Classification Search ................ 257/532
See application file for complete search history.

(56) References Cited

U.S. PATENT DOCUMENTS 3,555,369 A   1/1971  Yoshino et al.
3,900,416 A   8/1975  Vincent
4,599,678 A   7/1986  Wertheimer et al.
5,923,056 A   7/1999  Lee et al.
2003/0090859 A1  5/2003  Monden et al.
2003/0114018 A1  6/2003  Gutsche et al.

FOREIGN PATENT DOCUMENTS

| DE | 42 34 423 A1 | 4/1994 |
| DE | 199 49 993 C1 | 5/2001 |
| DE | 102 23 697 A1 | 12/2003 |
| EP | 0 452 955 B1 | 1/1996 |
| EP | 1 217 637 A2 | 6/2002 |
| GB | 1 540 131 | 2/1979 |
| GB | 2 353 404 A | 2/2001 |
| WO | WO 95/03618 A1 | 2/1995 |
| WO | WO 01/52284 A1 | 7/2001 |

OTHER PUBLICATIONS

Ulrich, R. et al.; "Putting Passives In Their Place"; IEEE Spectrum, Jul. 2003; 5 pages.
Redinger, D. et al.; "An all-printed passive component technology for low-cost RFID"; Device Research Conference Digest 2003; pp. 187-188.

*Primary Examiner*—Carl Whitehead, Jr.
*Assistant Examiner*—Monica D Harrison
(74) *Attorney, Agent, or Firm*—Edell, Shapiro & Finnan, LLC

(57) ABSTRACT

A capacitor is formed that includes a self-organized monolayer of an organic compound between two electrodes.

8 Claims, 2 Drawing Sheets

CAPACITOR WITH A DIELECTRIC INCLUDING A SELF-ORGANIZED MONOLAYER OF AN ORGANIC COMPOUND

CROSS REFERENCE TO RELATED APPLICATIONS

This application claims priority under 35 USC § 119 to German Application No. DE 10 2004 005 082.1, filed on Feb. 2, 2004, and titled "Capacitor with a Dielectric Comprising a Self-Organized Monolayer of an Organic Compound," the entire contents of which are hereby incorporated by reference.

FIELD OF THE INVENTION

The invention relates to capacitors for semiconductors in which the dielectric includes an organic compound.

BACKGROUND

The semiconductor industry is developing chips which have ever smaller structures, and consequently an ever increasing density of components, to increase the computing speed of processors, the storage volume of memory elements and the power of capacitors, and also to lower the costs for the components.

The increasing miniaturization and integration of complex electronic circuits requires not only the integration of semiconducting components but also an integration of passive components, such as, for example, capacitors, coils, resistors, etc. The variety of application areas has had the effect that the microchips have to meet much more stringent requirements. Since the microchips are present in many everyday devices, such as, for example, computers, cell phones, GPS receivers, CD/DVD drives, cameras, pocket calculators, wristwatches, domestic appliances, cars, etc., both the active semiconductor elements and the passive semiconductor elements have to satisfy many different requirements.

The capacitors at the present time are produced by using inorganic dielectrics, for example, insulating metal oxides arranged between two electrodes, and are initially completed as individual pieces during the fabrication of printed circuit boards and then placed individually on the PCB and soldered by means of conventional construction and connecting techniques. However, these techniques require the use of complex and cost-intensive "pick-and-place" machines, with the effect of increasing production costs.

Microchips that are presently used are generally based on silicon as the semiconductor material. The production of the passive components and the integration of these components are still comparatively complex and expensive in spite of the advanced methods of production. In the case of some areas of use, these costs are not significant, since the memory units usually remain on the item for a considerable time or are used for goods which command a high price. There are, however, a whole series of applications in which goods that are relatively inexpensive are used and the attached microchips make up a significant proportion of the costs, with the result that the remaining components that would otherwise be used are ruled out of everyday use for reasons of cost.

A considerable cost reduction and time saving could be achieved, for example, by using RFID tags (Radio Frequency Identification Tags) in the retail sector. In the case of these applications, the price of an RFID tag for labeling products must not exceed that of a conventional barcode tag. Therefore, in this "low performance" area, the production costs must be fractions of a cent.

Furthermore, the microchips must have properties such as great robustness or low weight, to allow them to be processed without any problems, or else have great flexibility, to allow them to also be used on curved surfaces.

Attempts have been made to develop capacitors which can be integrated in the various substrates without the use of "pick-and-place" machines. For example, R. Ulrich and L. Shaper: IEEE Spectrum, July 2003, have proposed creating a capacitor including inorganic dielectrics and metal electrodes directly on or in the printed circuit boards in a multistage production process. This multilayer construction is intended to be used on various substrates, such as, for example, fixed PCB substrates, for example FR4 or flexible PCBs made of polyamide. The problem with this technology is the relatively low thermal stability of the PCB materials, since the depositing of high-quality inorganic dielectrics generally requires temperatures above approximately 400° C. The result is therefore a compromise in which a low quality and reliability of the dielectrics is deliberately accepted in order to permit integration in the PCBs.

A further possibility for the integration of capacitors on flexible substrates specifically for cost-driven RFID applications is described in D. Redinger et al.: Device Research Conference Digest 2003, 187–188. This approach is based on printing techniques in the case of which both the electrodes and the dielectric of the capacitor are deposited by using low-cost printing processes. Allowance is made for the low thermal budget of the flexible polymeric substrates by using organic polymer dielectrics, such as a polyamide with a maximum process temperature of 190° C. The problem with this solution is the large space requirement of capacitors produced in this way, since the creation of polymer layers with adequately good insulating properties generally requires layer thicknesses of several 100 nm. The capacitor proposed by Redinger et al. has a polyimide layer thickness of approximately 1 µm. However, the power of a capacitor depends on the layer thickness and can be represented by the following formula:

$$C = \epsilon \cdot A/t$$

where C is the capacitance, $\epsilon$ is the dielectric constant, A is the surface area and t is the layer thickness of the dielectric. Consequently, a great layer thickness inevitably leads to a small capacitance per unit area. When polymer layers of approximately 1 µm are used, as described by Redinger et al., a large capacitance can be achieved only by increasing the surface area. For example, RFID transponders which are intended for the 13.56 MHz frequency band require a resonance capacitor of 0.4 nF, with the result that, if the layer thickness described by Redinger et al. is used, this capacitor would take up a surface area of approximately 25 mm².

SUMMARY OF THE INVENTION

An object of the invention is therefore to provide capacitors in which the dielectric has a layer thickness of just a few nanometers, the capacitors can be produced by customary semiconductor techniques, the capacitors can be easily incorporated in printed circuit boards, and as a result do not require use of "pick-and-place" machines.

Another object of the invention is to provide capacitors that can be incorporated in various substrates and have good electrical properties.

The aforesaid objects are achieved individually and/or in combination, and it is not intended that the present invention be construed as requiring two or more of the objects to be combined unless expressly required by the claims attached hereto.

In accordance with the present invention, a capacitor includes a first electrode, a second electrode, and a dielectric layer arranged between the first electrode and the second electrode. The dielectric layer is formed from a self-organized monolayer.

Preferably, the organic compound includes an anchor group, a linker chain and a head group, where the anchor group includes at least one of R—$SiCl_3$, R—$SiCl_2$-alkyl, R—SiCl(alkyl)$_2$, R—Si(OR)$_3$, R—Si(OR)$_2$-alkyl, R—SiOR (alkyl)$_2$, R—PO(OH)$_2$, R—CHO, R—CH=$CH_2$, R—SH, R—$S^-$, R—$COO^-$ and R—COSH, the linker chain includes at least one of —$(CH_2)_{n1}$— and —$(O$—$CH_2)_{n2}$—, where n1 is from 2 to 20 and n2 is from 2 to 10, and the head group includes an aromatic group.

In accordance with another embodiment of the present invention, a method for producing a capacitor includes the steps of depositing a first electrode, bringing the first electrode into contact with an organic compound to deposit a monolayer of the organic compound on the first electrode so as to form a structure of the first electrode and the organic compound, and depositing a second electrode.

The above and still further objects, features and advantages of the present invention will become apparent upon consideration of the following detailed description of specific embodiments thereof, particularly when taken in conjunction with the accompanying drawings.

DESCRIPTION OF THE PREFERRED EMBODIMENTS

Figure 1:
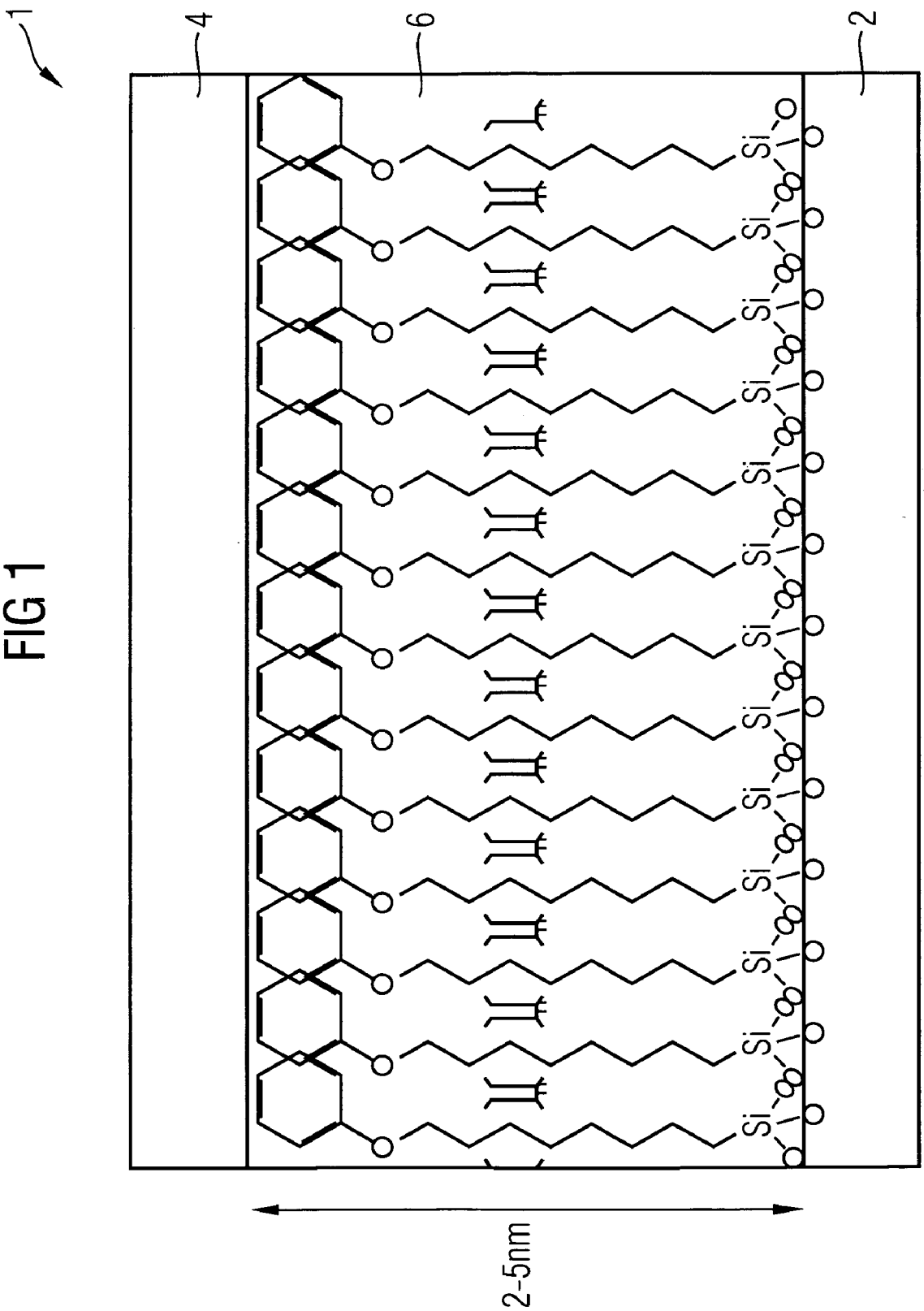
FIG. 1 depicts a schematic of a capacitor structure in accordance with the invention.

The capacitor according to the invention includes a number of significant advantages including, without limitation, the capacitor being produced by a simple method and used on any desired substrates while using organic self-organized monolayers as the capacitor dielectric. The construction of these thin-film capacitors takes place by conventional layer construction (electrode-dielectric-electrode), it being possible for the three layers to be created one after the other by using evaporation processes, printing processes or immersion processes. In this case, the evaporation temperatures of the organic compounds which form the dielectric monolayer on the electrode surface are particularly favorable for deposition on flexible substrates, since the temperature at which the depositing takes place is generally less than 200° C. The layer thickness of the dielectric is merely the thickness of a monolayer and corresponds approximately to the molecule length, with the result that the dielectric thickness is in the range of approximately 2 to 10 nm. On this basis outstanding electrical properties of the capacitor according to the invention can be achieved.

For example, for an RFID transponder which is intended for the 13.56 MHz frequency band and requires a resonance capacitor of 0.4 nF, a capacitor according to the invention merely requires a surface area of 0.04 mm$^2$. That is 0.16% of the area requirement of the polyimide capacitor described by Redinger et al. Capacitors with greater or smaller capacitances can be created by definition of the electrode surface areas.

An important factor for the outstanding dielectric properties is the molecular design of the organic compound, which includes an anchor group, a head group and a linker chain linking the anchor group and the head group. Here, the reactive anchor group attaches the molecule to the electrode surface, preferably by a covalent bond, which results in particularly high thermal, mechanical and chemical stability of the monolayer. The linker chain, which is preferably formed by an n-alkyl chain or an ether chain, brings about a virtually orthogonal alignment, and consequently the densest possible packing of the molecules. The head group, which preferably has a π-system or some other radical capable of intermolecular interactions, serves for stabilizing the monolayer by using the intermolecular interactions (ππ-interaction) to make molecules interact to a greater extent with their respective neighbor and consequently be additionally stabilized mechanically and electrically. As a consequence, such layers are better insulators than comparable monolayers without corresponding head groups.

One particular advantage of the materials according to the invention is the variability with respect to the electrode material obtained by choosing suitable reactive anchor groups. In principle, all metals or alloys or semimetals which have a natural oxide film and/or can be superficially oxidized in a simple way are suitable as electrode material. Furthermore, other metals and their alloys that are capable of forming covalent bonds or other strong interactions with organic reactive groups, such as, for example, gold, silver, copper and gallium arsenide in the case of the thiol anchor groups, are also suitable as electrode material for use in the invention.

Thus, the capacitor according to the invention permits technically simple integration on any desired substrates, the production of capacitors with a comparatively small area requirement is possible (since the layer thickness of the dielectric layer is in the nanometer range), and there also is great variability in the choice of electrode materials in forming the capacitor.

In one particular embodiment of the invention, the layer thickness of the dielectric has the length of a single molecule and is in the range of about 1 to about 10 nm. The length of the molecule is intended to permit an orthogonal alignment, with the result that it is very difficult for shorter molecules that are less than 1 nm to form a monolayer. In the case of the molecules that are longer than 10 nm, it is difficult to obtain the orthogonal alignment because of many degrees of freedom. In a preferred embodiment, the layer thickness of the dielectric is in the range of about 2 nm to about 5 nm.

As already mentioned above, the head group can be any group that permits an intermolecular interaction between two molecules. According to the invention, π-systems may serve as the head group, since a ππ-interaction can come about as a result, which contributes to the stabilization of the monolayer. The π-systems according to the invention may also be substituted by heteroatoms.

All groups permitting an orthogonal alignment of the molecule and keeping the spacing between the head group and the anchor group stable are suitable as linker groups. In one particular embodiment of the invention, the linker chains are formed by n-alkyl chains or polyether chains. The π-alkyl or polyether chains have repeat units —$(CH_2)_n$— or —$(O$—$CH_2$—$CH_2)_n$—, with n in the range from approximately 2 to 20 for the n-alkyl chain and in the range from 2 to 10 for the polyether chain.

As already described above, the electrodes may consist of all metals or metal alloys or semimetals, the only important factor being that the electrode material preferably enters into a covalent bond with the anchor group. However, some other interaction, such as, for example ionic interaction, hydrogen bridging or charge-transfer interaction, also comes into consideration.

Aluminum, titanium, gold, silver, copper, palladium, platinum, nickel, silicon and gallium arsenide are preferred for the electrode materials. If the electrode material consists of aluminum or titanium, the surface can be oxidized in a simple way, to allow it to be reacted with anchor groups. To this end, R—$SiCl_3$; R—$SiCl_2$-alkyl, R—$SiCl(alkyl)_2$; R—Si$(OR)_3$; R—$Si(OR)_2$-alkyl; R—$SiOR(alkyl)_2$ and/or R—PO$(OH)_2$ are preferred as anchor groups.

If silicon with a native or specifically generated silicon oxide layer, such as, for example, hydroxy-terminated silicon, is used, the following are preferred as anchor groups: R—$SiCl_3$; R—$SiCl_2$-alkyl; R—$SiCl(alkyl)_2$; R—$Si(OR)_3$; R—$Si(OR)_2$-alkyl and R—$SiOR(alkyl)_2$.

If silicon with a hydrogen surface is used as the electrode material, the preferred anchor groups are R—CHO(hv) and R—CH=$CH_2$(hv).

For the second electrode, which does not have to enter into a covalent bond with the self-organized monolayer, all electrically conductive materials are suitable, in particular metals and conductive polymers.

Since the depositing of the organic molecules which form the dielectric monolayer on the electrode surface is particularly gentle, and very suitable for flexible substrates, in a preferred embodiment the capacitor according to the invention is incorporated in flexible substrates.

The schematic construction of a capacitor according to the invention is depicted in FIG. 1. Between first electrode 2 and second electrode 4 of the capacitor 1, there is a layer 6 of an organic molecule that enters into a covalent bond (via its anchor group) with the first electrode 2, has a virtually orthogonal alignment (from its linker chain to its head group) between the two electrodes and by which the π-system for the second electrode 4 is stabilized. The first electrode 2 consists of natively oxidized silicon and the second electrode 4 consists of gold.

The production of the capacitor according to the invention takes place by depositing the first electrode, bringing the first electrode into contact with the organic compound to obtain a self-organized monolayer of the compound on the first electrode, appropriate rinsing of the structure with the solvent in which the compound was dissolved is then conducted to remove the excess compound, followed by evaporating of the solvent and depositing the second electrode.

The rinsing of the excess compound only takes place if the compound is dissolved in a solvent. In a preferred embodiment such as previously described, the compound is brought into contact with the first electrode in the solution. However, other methods for depositing the organic compound are possible.

The concentration of the organic compound of which the solution is brought into contact with the first electrode is preferably between about $10^{-4}$ and about 1% by weight. This concentration in the range from about $10^{-4}$ to about 1% by weight is suitable in particular for producing dense layers. It is also possible, however, to use less concentrated or more (i.e., highly) concentrated solutions of the organic compounds. The depositing can then take place by immersing the substrate with a defined first electrode in the prepared solution, after which the rinsing with the pure process solvent can take place. Optionally, the structure obtained in this way may subsequently be rinsed with a readily volatile solvent, such as acetone or dichloromethane for example, and subsequently dried under inert gas. The preferred solvents for dissolving the organic compounds are dried, low-polarity, aprotic solvents. Examples of such solvents include toluene, tetrahydrofuran and cyclohexane.

If the organic compound is brought into contact with the first electrode from the gas phase, the pressure is preferably between about $10^{-6}$ mbar and about 400 mbar, depending upon the volatility of the organic compound. The process temperature is preferably in the range from about 80° C. to about 200° C. and the depositing time lies between about 3 min and about 24 hours.

When the molecular self-organized monolayer is obtained, the second electrode can be deposited, for example, by vapour-depositing.

Figure 2:
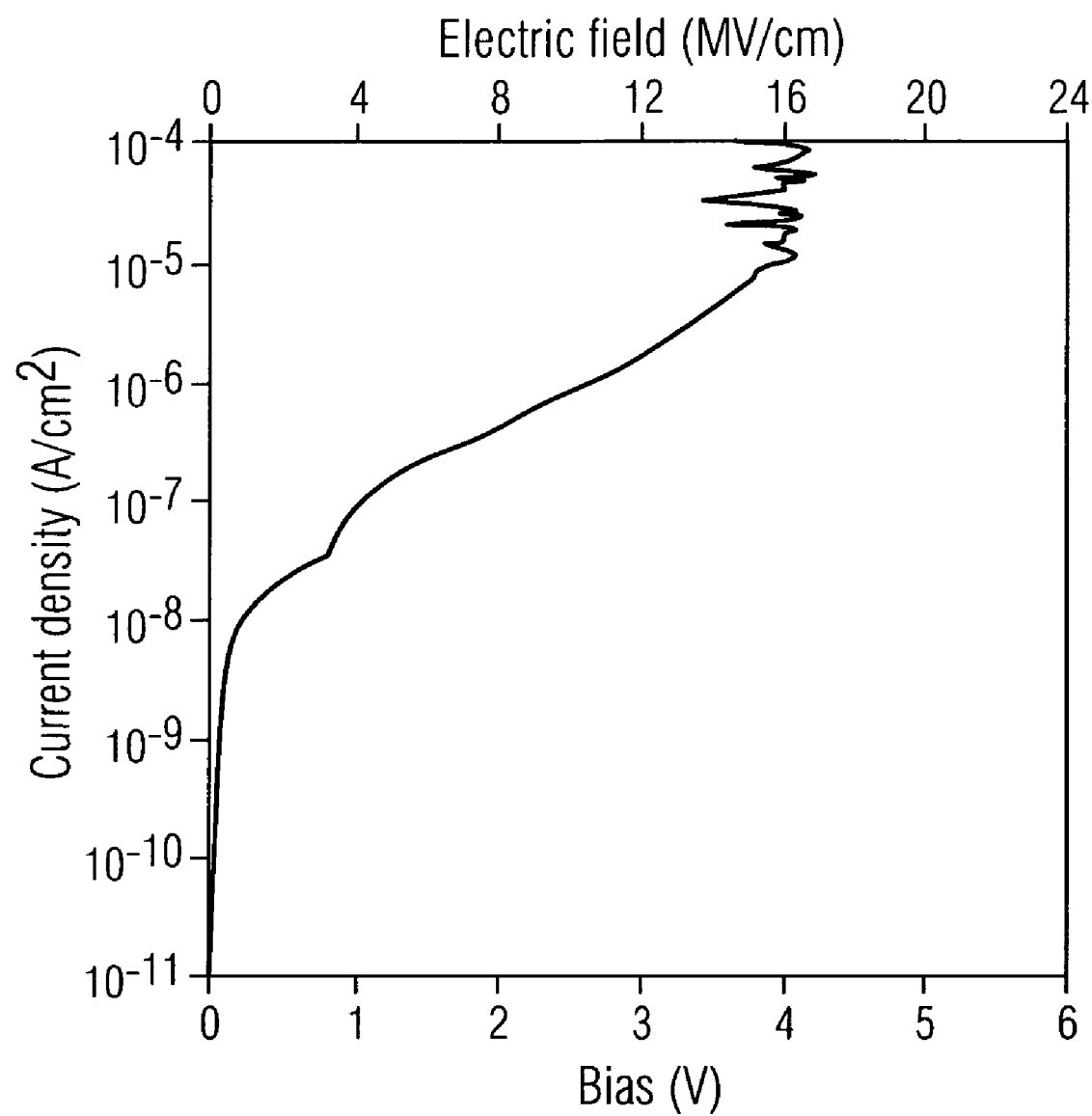
FIG. 2 is a diagram of current density vs. voltage for a capacitor structure formed in accordance with the invention.

The electrical properties of the capacitor according to the invention are explained with reference to FIG. 2. In particular, FIG. 2 depicts the current-voltage characteristic of a capacitor including a lower electrode made of monocrystalline, natively oxidized silicon, an organic self-organized monolayer as the dielectric ((18-phenoxyoctadecyl)-trichlorosilane, 2.5 nm thick) and an upper electrode made of thermally vapor-deposited gold (30 nm thick). The characteristic demonstrates the excellent insulating properties of the self-organized monolayer, which can withstand an electrical voltage of up to 4 V, which corresponds to an electric field strength of 16 MV/cm. The leakage current (which, although undesired, is unavoidable and flows over the dielectric on account of the voltage present between the electrodes, leading to a slow loss of charge) increases in the expected way as the voltage increases, until a breakdown occurs at a voltage of 4 V (16 MV/cm). In the case of the capacitor which can be used for an RFID transponder, an extremely small leakage current of approximately 10 pA flows when there is a voltage of 2 V.

While the invention has been described in detail and with reference to specific embodiments thereof, it is believed that other modifications, variations and changes will be suggested to those skilled in the art in view of the teachings set forth herein. It is therefore to be understood that all such variations, modifications and changes are believed to fall within the scope of the present invention as defined by the appended claims and their equivalents.

What is claimed is:

1. A capacitor comprising:
   a first electrode;
   a second electrode; and
   a dielectric layer arranged between the first electrode and the second electrode, the dielectric layer being formed from a monolayer of an organic compound which includes an anchor group, a linker chain and a head group, wherein the anchor group comprises at least one of R—$SiCl_3$, R—$SiCl_2$-alkyl, R—$SiCl(alkyl)_2$, R—Si$(OR)_3$, R—$Si(OR)_2$-alkyl, R—$SiOR(alkyl)_2$, R—PO$(OH)_2$, R—CHO, R—CH=$CH_2$, R—SH, R—$S^-$, R—$COO^-$ and R—COSH, the linker chain comprises at least one of —$(CH_2)_{n1}$— and —$(O—CH_2)_{n2}$—, where n1 is from 2 to 2 and n2 is from 2 to 10, and the head group comprises an aromatic group.

2. The capacitor of claim 1, wherein the monolayer includes a layer thickness from 1 nm to 10 nm.

3. The capacitor of claim 1, wherein the monolayer includes a layer thickness from 2 nm to 5 nm.

4. The capacitor of claim 1, wherein the first electrode is constructed of a material comprising at least one of Al, Ti, polycrystalline silicon and monocrystalline silicon.

5. The capacitor of claim 1, wherein the first electrode is constructed of a material comprising one of Au and GaAs.

6. The capacitor of claim 1, wherein the second electrode is constructed of a material comprising one of Au, Cu, Al, Ti, Ag, Cr, In, Pt, Mg, Pd, Mo, Ni, Zn and Sn.

7. The capacitor of claim 1, wherein the first electrode includes a metal-oxide film disposed on a side of the first electrode that faces the dielectric.

8. The capacitor of claim 1, wherein the capacitor is arranged on a flexible substrate.

\* \* \* \* \*